United States Patent
Guo et al.

(10) Patent No.: US 9,059,271 B2
(45) Date of Patent: Jun. 16, 2015

(54) SELF-ALIGNED III-V MOSFET FABRICATION WITH IN-SITU III-V EPITAXY AND IN-SITU METAL EPITAXY AND CONTACT FORMATION

(71) Applicant: International Business Machines Corporation, Armonk, NY (US)

(72) Inventors: Dechao Guo, Fishkill, NY (US); Shu-Jen Han, Cortlandt Manor, NY (US); Jeehwan Kim, Los Angeles, CA (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 13/950,777

(22) Filed: Jul. 25, 2013

(65) Prior Publication Data

US 2013/0309830 A1    Nov. 21, 2013

Related U.S. Application Data

(63) Continuation of application No. 13/013,206, filed on Jan. 25, 2011, now abandoned.

(51) Int. Cl.
*H01L 21/336* (2006.01)
*H01L 29/78* (2006.01)
(Continued)

(52) U.S. Cl.
CPC ............ *H01L 29/78* (2013.01); *H01L 29/0847* (2013.01); *H01L 29/41783* (2013.01);
(Continued)

(58) Field of Classification Search
CPC ............ H01L 27/1203; H01L 27/3211; H01L 27/3276; H01L 29/0619; H01L 29/0634; H01L 29/0649; H01L 29/0696; H01L 29/0843; H01L 29/0878; H01L 29/16; H01L 29/1604; H01L 29/167; H01L 29/2003; H01L 29/04

USPC .................. 257/350, 401, 704, 769, E29.111; 438/285, 581, 583, 649, 655
See application file for complete search history.

(56) References Cited

U.S. PATENT DOCUMENTS

| 4,404,732 A | 9/1983 | Andrade .......................... 29/571 |
| 4,735,913 A | 4/1988 | Hayes .............................. 437/39 |

(Continued)

OTHER PUBLICATIONS

"Improved low temperature characteristics of P-channel MOSFETs with $Si_{1-x}Ge_x$ raised source and drain", Huang et al., IEEE, Aug. 2001, p. 1627-1632.

(Continued)

*Primary Examiner* — Mark A Laurenzi
(74) *Attorney, Agent, or Firm* — Harrington & Smith; Louis J. Percello

(57) ABSTRACT

A method for forming a transistor includes providing a patterned gate stack disposed on a III-V substrate and having sidewall spacers formed on sides of the patterned gate stack, the III-V substrate including source/drain regions adjacent to the sidewall spacers and field oxide regions formed adjacent to the source/drain regions. The method includes growing raised source/drain regions on the source/drain regions, the grown raised source/drain regions including III-V semiconductor material, and growing metal contacts on the grown raised source/drain regions. Another method for forming a transistor includes providing a patterned gate stack disposed on a III-V substrate and having sidewall spacers formed on sides of the patterned gate stack, the III-V substrate including source/drain regions adjacent to the sidewall spacers and field oxide regions formed adjacent to the source/drain regions. The method includes growing metal contacts on the source/drain regions. Transistors and computer program products are also disclosed.

20 Claims, 3 Drawing Sheets

(51) Int. Cl.
*H01L 29/08* (2006.01)
*H01L 29/417* (2006.01)
*H01L 29/45* (2006.01)
*H01L 29/66* (2006.01)

(52) U.S. Cl.
CPC ........ *H01L29/452* (2013.01); *H01L 29/66522* (2013.01); *H01L 29/66628* (2013.01); *H01L 29/66477* (2013.01)

(56) References Cited

U.S. PATENT DOCUMENTS

| | | | |
|---|---|---|---|
| 2004/0191998 A1 | 9/2004 | Natzle et al. | 438/300 |
| 2010/0075499 A1* | 3/2010 | Olsen | 438/682 |
| 2010/0123205 A1* | 5/2010 | de Souza et al. | 257/410 |

OTHER PUBLICATIONS

"First CMOS-compatible III-V n-MOSFET with self-aligned contacts", Semiconductor Today, Jun. 2010, 3 pgs.

"Controlled fabrication of InGaAs quantum dots by selective area epitaxy MOCVD growth", V.C. Elarde et al., Elsevier B.V. 2004, p. 148-153.

"GaAs MOSFET Using InAlP Native Oxide as Gate Dielectric", X. Li, et al., IEEE Electron Device Letters, vol. 25, No. 12, Dec. 2004, p. 772-774.

"Microstructure and Properties of Aluminum Contacts Formed on GaAs(100) by Low Pressure Chemical Vapor Deposition with Dimethylethylamine Alane Source", V. Shashkin et al., Journal of Electronic Materials, vol. 30, No. 8, 2001, p. 980-986.

"Ultra-Low Resistance Ohmic Contacts in InGaAs/InP", U. Singisetti et al., IEEE 2007, p. 149-150.

"Growth of aluminum on Si using dimethyl-ethyl amine alane", Yoichiro Neo et al., Elsevier Science B.V., 1999, p. 443-446.

"Studies of Ohmic Contact and Schottky Barriers on Au—Ge/GaAs and Au—Ti/GaAs", R. V. Ghita et al., Journal of Optoelectronics and Advanced Materials, vol. 7, No. 6, Dec. 2005, p. 3033-3037.

"Optimization of Selective Area Growth of GaAs by Low Pressure Organometallic Vapor Phase Epitaxy for Monolithic Integrated Circuits", H. Kanber et al., Journal of Electronic Materials, vol. 23, No. 2, 1994, p. 159-166.

* cited by examiner

Selectively grow metal contact on raised source/drain

Selectively grow metal contact on source/drain

US 9,059,271 B2

SELF-ALIGNED III-V MOSFET FABRICATION WITH IN-SITU III-V EPITAXY AND IN-SITU METAL EPITAXY AND CONTACT FORMATION

CROSS REFERENCE

This application is a continuation of U.S. patent application Ser. No. 13/013,206, filed on Jan. 25, 2011, the contents of which are incorporated herein by reference in their entirety.

BACKGROUND

This invention relates generally to III-V semiconductors and, more specifically, relates to contacts and MOSFETs formed on III-V semiconductors.

Self-aligned integration of III-V metal-oxide-semiconductor field effect transistor (MOSFET) is either challenging or complicated. In typical silicon-based semiconductor processing, there is a self-aligned silicide process, which is a process of forming a surface layer of metal silicide on a silicon substrate. Additionally, in III-V processing, there is a similar process (called germinide) to achieve self-aligned integration. Typically, germinide involves the selective growth of germanium at III-V source/drain regions, followed by subsequent formation of Ni—Ge alloys for contacts. Nevertheless, the challenges of this process include the high resistance of grown germanium layers and the high contact resistance between Ni—Ge alloy and the grown germanium.

Thus, there are few options in current III-V semiconductor processing for forming contacts on III-V semiconductors.

SUMMARY

In an exemplary embodiment, a method for forming a transistor is disclosed that includes providing a patterned gate stack disposed on a III-V substrate and having sidewall spacers formed on sides of the patterned gate stack, the III-V substrate including source/drain regions adjacent to the sidewall spacers and field oxide regions formed adjacent to the source/drain regions. The method includes growing raised source/drain regions on the source/drain regions, the grown raised source/drain regions including III-V semiconductor material, and growing metal contacts on the grown raised source/drain regions.

In another exemplary embodiment, another method for forming a transistor is disclosed that includes providing a patterned gate stack disposed on a III-V substrate and having sidewall spacers formed on sides of the patterned gate stack, the III-V substrate including source/drain regions adjacent to the sidewall spacers and field oxide regions formed adjacent to the source/drain regions. The method includes growing metal contacts on the source/drain regions.

In a further exemplary embodiment, a transistor is disclosed that includes a III-V substrate, and a patterned gate stack disposed on the III-V substrate. The pattern gate stack has sidewall spacers formed on sides of the patterned gate stack. The III-V substrate includes source/drain regions adjacent to the sidewall spacers and field oxide regions formed adjacent to the source/drain regions. The transistor includes raised source/drain regions on the source/drain regions, the raised source/drain regions comprised of III-V semiconductor material. The transistor also includes metal contacts on the raised source/drain regions.

In another exemplary embodiment, a computer program product is disclosed that includes a computer readable storage medium having computer readable program code embodied therewith, the computer readable program code configured to cause one or more semiconductor processing apparatus to perform at least the following: on a provided semiconductor including a III-V substrate having a patterned gate stack disposed on the III-V substrate and having sidewall spacers formed on sides of the patterned gate stack, the III-V substrate comprising source/drain regions adjacent to the sidewall spacers and field oxide regions formed adjacent to the source/drain regions, growing raised source/drain regions on the source/drain regions, the grown raised source/drain regions including III-V semiconductor material; and growing metal contacts on the grown raised source/drain regions.

DETAILED DESCRIPTION

As described above, there are few options in III-V semiconductor processing for forming contacts on III-V semiconductors. Exemplary embodiments herein propose techniques and resultant structures for self-aligned metal contacts, such as aluminum (Al) metal contacts, formed on III-V semiconductors. In particular, techniques are disclosed for forming self-aligned metal contacts on n+GaAs source/drain regions of a MOSFET.

Figure 1:
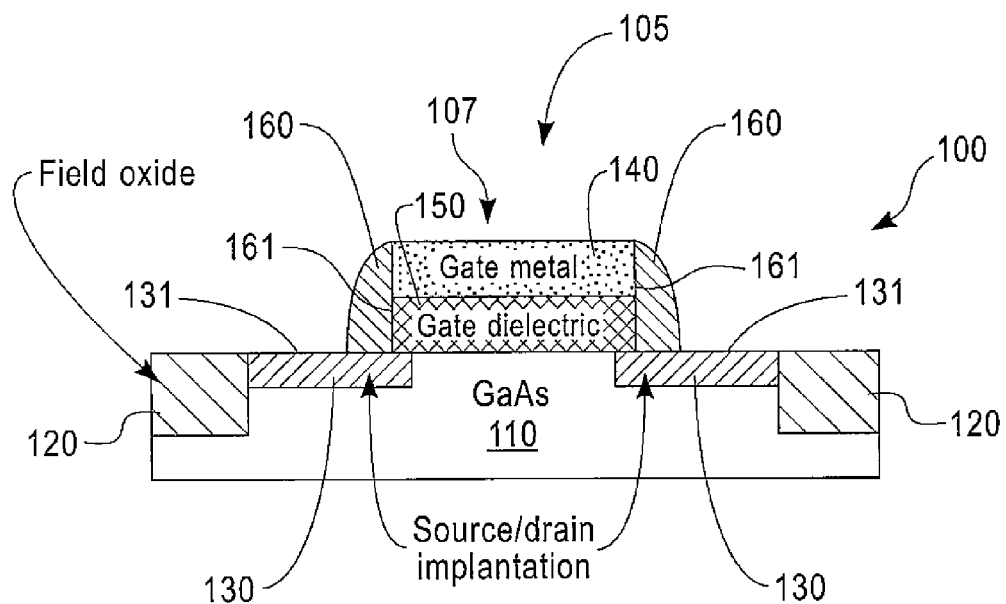
FIG. 1 is an enlarged cross-sectional view of a III-V semiconductor structure (e.g., a MOSFET) after source/drain implantation.

Turning now to FIG. 1, an enlarged cross-sectional view is shown of a III-V semiconductor structure 105 (e.g., a MOSFET) after source/drain implantation. MOSFET 105 resides on part of a III-V semiconductor 100. Semiconductor 100 includes a gallium arsenide (GaAs) substrate 110 and insulating regions 120 (e.g., to isolate MOSFET 105 from other MOSFETs or other devices). The insulating regions 120 are comprised of, e.g., silicon nitride, silicon oxide and alumina, which can be made by, in an exemplary embodiment, chemical vapor deposition (CVD) and atomic layer deposition (ALD). Prior to source/drain implantation, a gate stack is formed by forming an underlying layer of gate dielectric 150 and an overlying layer of gate metal 140. The typical gate dielectric is silicon nitride, silicon oxide, alumina, or hafnium oxide form by either CVD or ALD. The thickness range of the gate dielectric is 0.1 nm-20 nm. The layers 140, 150 are patterned via known techniques (e.g., etching) to form the patterned gate stack 107. The sidewall spacers 160 are formed by deposition of a layer silicon nitride or silicon oxide such that the layer is formed on the sidewalls 161 of the patterned gate stack 107. The layer is then selectively etched so that the sidewall spacers 160 have a thickness in the range of 1 nm-100 nm.

The MOSFET 105 includes the source/drain regions 130 that are in this example implantation regions. The source/drain implantation regions 130 can be created using either n+ implantation or p+ implantation, depending on whether an N-MOSFET or P-MOSFET, respectively, is being made. The common elements for n+ implantation are Si, Ge, S, Se, and Te, while those for p+ implantations are C (carbon), Mg, Be, and Zn. These source/drain implantation regions 130 may be formed, e.g., via ion implantation and an activation anneal. It is also noted that the regions 130 may be source/drain regions formed via other techniques, such as diffusion.

Figure 2:
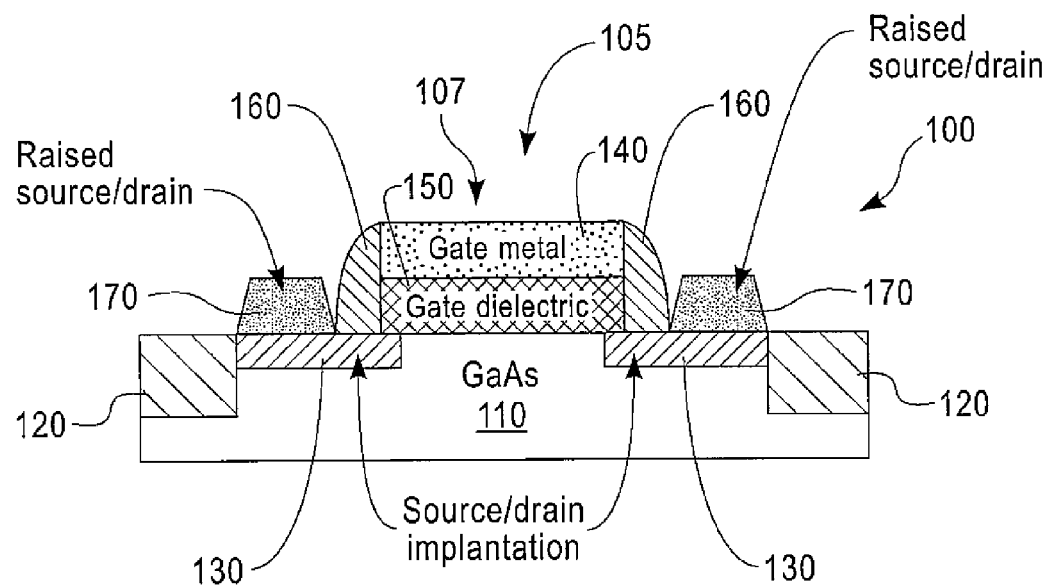
FIG. 2 is an enlarged cross-sectional view of the III-V semiconductor structure (e.g., a MOSFET) of FIG. 1 after selective growth of raised source/drain regions on the GaAs substrate.

Turning now to FIG. 2, an enlarged cross-sectional view of the MOSFET 105 of FIG. 1 is shown after selective growth in a chemical vapor deposition (CVD) tool of GaAs raised source/drain regions 170 on the GaAs substrate. In an example, GaAs raised source/drain regions 170 are doped n+ and may be formed using techniques described in, e.g., Kanber et al., "Optimization of Selective Area Growth of GaAs by Low Pressure Organometallic Vapor Phase Epitaxy for Monolithic Integrated Circuits", Journal of Electronic Materials, Vol. 23, No. 2 (1994). In Kanber, they used masks of $SiO_2$ or $Si_xN_y$, to provide selective growth of Si-doped GaAs (or undoped GaAs). In FIG. 2, however, the sidewall spacers 160 and the field oxide 120 provide selectivity to the growth of the n+ GaAs raised source/drain regions 170. That is, the materials in the sidewall spacers 160, the gate metal 140, and the field oxide 120 are not susceptible to growth of GaAs, while the GaAs in the source/drain regions 130 (e.g., at the surface 131) are susceptible to growth of GaAs.

As described in Kanber, the n+ GaAs raised source-drain regions may be doped using a dopant source, silane ($SiH_4$) (e.g., 2000 parts per million, ppm at a flow rate of 7 sccm, standard cubic centimeters per minute), while growing GaAs using a III-V semiconductor material source such as $AsH_3$ or tributylarsene (TBA) in a reactor having a pressure of 15 Torr with a substrate temperature of about 720 C. Hydrogen ($H_2$) may be used as a carrier gas at eight slm (standard liters per minute) and a flow rate of $AsH_3$ between 50 and 150 sccm. For a p+ implantation, one may replace the silane with, e.g., dimethylzinc. The growing process may be performed from 10 seconds (s) to 1000 s, to create raised source/drain region thicknesses from 10 nm-100 nm.

It is noted that after selectively growing the n+GaAs raised source/drain regions on the GaAs substrate 110, thermal annealing may be performed, e.g., to clean the surface of n+ GaAs before growing metal contacts such as Al. Nevertheless, this operation can be performed in the same CVD tool (i.e., reactor) as used to selectively grow the raised source/drains 170 without breaking the vacuum.

Figure 3:
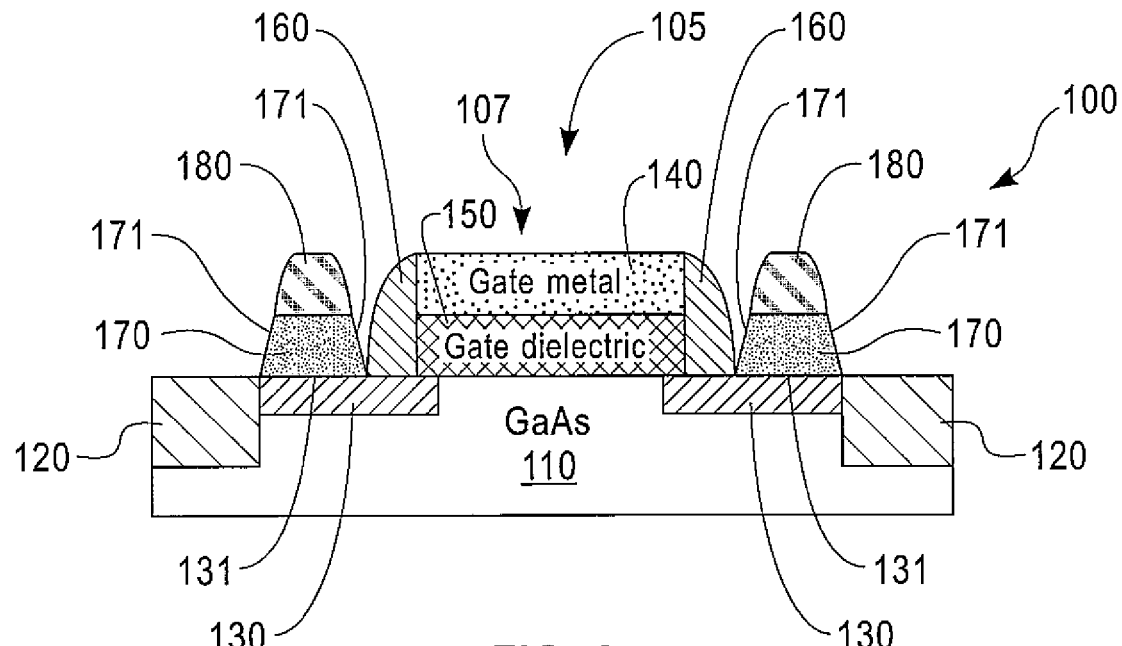
FIG. 3 is an enlarged cross-sectional view of the III-V semiconductor structure (e.g., a MOSFET) of FIG. 2 after selective growth of metal contacts on the raised source/drain regions.

Referring now to FIG. 3, an enlarged cross-sectional view is shown of the MOSFET 105 of FIG. 2 after selective growth of metal contacts 180 on the n+ GaAs raised source/drain regions 170. It is noted that selective growth of metal contacts 180 can be performed in the same CVD tool (i.e., reactor) as used to selectively grow the raised source/drains 170 without breaking the vacuum. The contacts 180 are formed from selective growth of contact metal on the raised source/drain regions 170. The selectivity occurs because, e.g., the structures (e.g., gate metal 140, sidewall spacers 160, field oxides 120) surrounding the raised source/drain 170 are not susceptible to growth of the contact metal whereas the material (e.g., n+ or p+ GaAs) in the raised source/drain regions are susceptible to growth of the contact metal. It should be noted that, in principle, the epitaxial growth rate is sensitive to the crystal orientation of the substrate. Therefore, the growth of Al is expected to be negligible on the sides 171 of the regions 170. However, there may be some growth of Al on the sides 171 of the regions 170.

As an example, in order to selectively grow Al contacts 180 on the n+ GaAs raised source/drain regions 170, the semiconductor 100 is subjected (i.e., in the same CVD reactor used to selectively grow the raised source/drains 170) to an appropriate temperature range (of the semiconductor 100) of 150 C-360 C. The precursor selected may be, e.g., dimethyl-ethyl amine alane (DMEAA). The carrier gas can be $H_2$ or $N_2$. The range of the reactor pressure is 0.001 mbar to 100 mbar (e.g., about 50 mbar). The range of the flow rate of DMEAA is about 0.1 to about 100 µmole/min (micro-mole per minute). The range of Al deposition rate is about 0.1 to about 100 nanometers (nm)/min. The range of contact thicknesses is 1 nm to 300 nm.

The remainder of the MOSFET process flow may be conventional for III-V processing. For instance, an additional thermal annealing step may be used to further reduce the contact resistance. Nevertheless, this step is optional and may not be necessary for the process flow.

Figure 4:
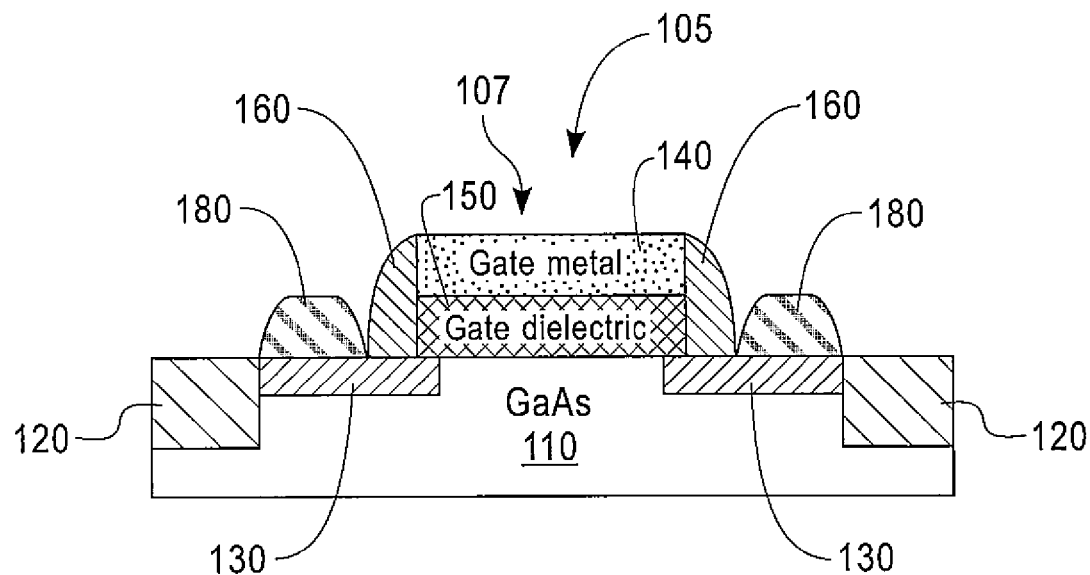
FIG. 4 is an enlarged cross-sectional view of the III-V semiconductor structure (e.g., a MOSFET) of FIG. 1 after selective growth of metal contacts on the source/drain regions.

Optionally, the metal contacts 180 may be selectively grown directly on the source/drain implantation regions 130. FIG. 4 is an enlarged cross-sectional view of the MOSFET 105 of FIG. 1 after selective growth of metal contacts on the source/drain implantation regions 130. The techniques described above in reference to FIG. 3 may be used to form the metal contacts 180 on the source/drain implantation regions 130. It should be noted that the raised source/drain regions 170 help to reduce the resistance of the MOSFET 105.

Although the substrate 110 has been described as being GaAs, there should be equivalent processes for InGaAs, GaSb, and InP. This is because InGaAs, GaSb, and InP have the same crystal structure as GaAs and therefore, they will have similar material properties in terms of selective growth.

Integrated circuit chips resulting from the techniques described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Furthermore, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the instant invention may be written in any combination of one or more programming languages, including an object oriented programming language such as JAVA (a programming language), Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to semiconductor processing operations according to embodiments of the invention. It will be understood that the operations can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Figure 5:
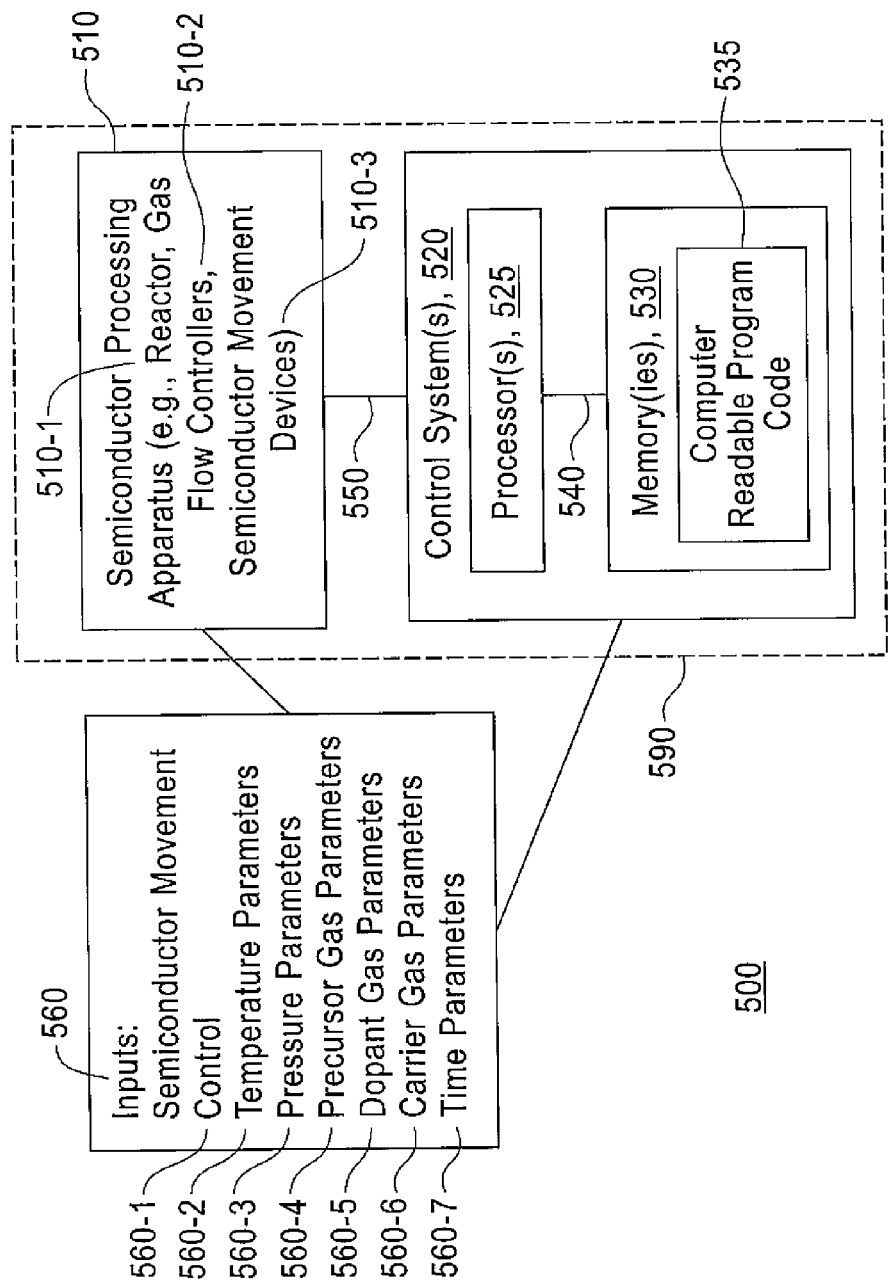
FIG. 5 is a block diagram of an exemplary system for performing semiconductor processing in accordance with exemplary embodiments herein.

For instance, an exemplary system 500 suitable for performing the processing shown in FIGS. 1-4 (and additional processing if desired) is shown in FIG. 5. In FIG. 5, one or more control systems 520 (e.g., computers) comprise one or more processors 525 coupled to one or more memories 530 via one or more networks (e.g., buses) 540. The one or more control systems 520 are coupled via one or more networks 550 to semiconductor processing apparatus 510 such as a reactor 510-1 (e.g., CVD tool), gas flow controllers 510-2 (e.g., if separate from the reactor 510-1) and semiconductor movement devices 510-3 (e.g., wafer positioning and movement systems). The one or more memories 530 comprise computer readable program code suitable for causing the semiconductor processing apparatus 510 to perform operations such as the operations shown in FIGS. 1-4.

The one or more control systems 520 may also manipulate the inputs 560 to the semiconductor processing apparatus 510. Such inputs 560 may include, e.g., semiconductor movement control parameters 560-1 (e.g., at what time a wafer should be moved, where the wafer should be placed), temperature parameters 560-2 (e.g., temperature of the wafer, potentially with ramp up or down rates), pressure parameters 560-3 (e.g., of the interior of the reactor 510-1), precursor gas parameters 560-4 (e.g., flow rates for particular precursors, which precursor gas should be used and for how long), dopant gas parameters 560-5 (e.g., flow rates for particular dopant gases, which dopant gas should be used and for how long), carrier gas parameters 560-6 (e.g., flow rates, which carrier gas should be used and for how long), and time parameters 560-7 (e.g., how long the reactor should process wafers at particular temperatures). It should be noted that a semiconductor processing apparatus 510 may include a corresponding control system 520 to create an integral semiconductor processing apparatus 590. For instance, an "integral" reactor 590 may have a corresponding control system 520 attached to a reactor 510-2. The control system 520 in such a case may be networked via one or more networks 550 to enable the control system 520 to be loaded with the computer readable program code 535.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for forming a transistor, comprising:
providing a patterned gate stack disposed on a III-V substrate and having sidewall spacers formed on sides of the patterned gate stack, the III-V substrate comprising source/drain regions adjacent to the sidewall spacers and field oxide regions formed adjacent to the source/drain regions; and growing metal contacts on the source/drain regions;

wherein growing metal contacts further comprises providing a carrier gas carrying a precursor in a reactor at a predetermined pressure while the III-V substrate has a predetermined temperature; and wherein the precursor comprises dimethyl-ethyl amine alane (DMEAA) and the predetermined temperature is between 150 Centigrade (C) –360 C.

2. The method of claim 1, further comprising forming the source/drain regions at least by implanting a dopant into the III-V substrate.

3. The method of claim 2, wherein the dopant comprises one or more of Si, Ge, S, Se, and Te for n+ implantation and one or more of C, Mg, Be, and Zn for p+ implantation.

4. The method of claim 1, further comprising performing thermal annealing of the III-IV substrate prior to the growing of the metal contacts.

5. The method of claim 1, wherein pressure of the reactor is between 0.001 millibar (mbar) to 100 mbar and a flow rate of the DMEAA is between 0.1 to 100 micro-mole per minute.

6. The method of claim 1, wherein the III-V substrate comprises one or more of GaAs, InGaAs, GaSb, or InP.

7. The method of claim 1, used in the fabrication of integrated circuit chips.

8. A method for forming a transistor, comprising:

providing a patterned gate stack disposed on a III-V substrate and having sidewall spacers formed on sides of the patterned gate stack, the III-V substrate comprising source/drain regions adjacent to the sidewall spacers and field oxide regions formed adjacent to the source/drain regions;

growing raised source/drain regions on the source/drain regions, the grown raised source/drain regions comprised of III-V semiconductor material; and growing metal contacts on the grown raised source/drain regions;

wherein:

growing raised source/drain regions on the source/drain regions further comprises providing a first carrier gas carrying a III-V material source and a dopant source in a reactor at a first predetermined pressure while the III-V substrate has a first predetermined temperature; and growing raised source/drain regions on the source/drain regions further comprises, without breaking vacuum in the reactor after growing the raised source/drain regions, providing a second carrier gas carrying a III-V material source and a dopant source in the reactor at a second predetermined pressure while the III-V substrate has a second predetermined temperature.

9. The method of claim 8, further comprising forming the source/drain regions at least by implanting a dopant into the III-V substrate.

10. The method of claim 9, wherein the dopant comprises one or more of Si, Ge, S, Se, and Te for n implantation and one or more of C, Mg, Be, and Zn for p implantation.

11. The method of claim 8, wherein growing raised source/drain regions on the source/drain regions further comprises providing a carrier gas carrying a III-V material source and a dopant source in a reactor at a predetermined pressure while the III-V substrate has a predetermined temperature.

12. The method of claim 11, further comprising performing thermal annealing of the III-IV substrate in the reactor without breaking vacuum in the reactor.

13. The method of claim 11, wherein the III-V material source comprises one or more of $AsH_3$ and tributylarsene.

14. The method of claim 8, wherein growing metal contacts further comprises providing a carrier gas carrying a precursor in a reactor at a predetermined pressure while the III-V substrate has a predetermined temperature.

15. The method of claim 14, wherein the precursor comprises dimethyl-ethyl amine alane (DMEAA) and the predetermined temperature is between 150 Centigrade (C) and 360 C.

16. The method of claim 15, wherein pressure of the reactor is between 0.001 millibar (mbar) to 100 mbar and a flow rate of the DMEAA is between 0.1 to 100 micro-mole per minute.

17. The method of claim 8, wherein the III-V substrate comprises one or more of GaAs, InGaAs, GaSb, or InP.

18. The method of claim 8, used in the fabrication of integrated circuit chips.

19. A computer program product, comprising:

a computer readable storage medium having computer readable program code embodied therewith, the computer readable program code configured to cause one or more semiconductor processing apparatus to perform at least the following:

on a provided semiconductor comprising a III-V substrate having a patterned gate stack disposed on the III-V substrate and having sidewall spacers formed on sides of the patterned gate stack, the III-V substrate comprising source/drain regions adjacent to the sidewall spacers and field oxide regions formed adjacent to the source/drain regions, growing raised source/drain regions on the source/drain regions, the grown raised source/drain regions comprised of III-V semiconductor material; and growing metal contacts on the grown raised source/drain regions;

wherein:

growing raised source/drain regions on the source/drain regions further comprises providing a first carrier gas carrying a III-V material source and a dopant source in a reactor at a first predetermined pressure while the Ill-V substrate has a first predetermined temperature; and growing raised source/drain regions on the source/drain regions further comprises, without breaking vacuum in a reactor after growing the raised source/drain regions, providing a second carrier gas carrying a III-V material source and a dopant source in the reactor at a second predetermined pressure while the III-V substrate has a second predetermined temperature.

20. A method for forming a transistor, comprising:

providing a patterned gate stack disposed on a III-V substrate and having sidewall spacers formed on sides of the patterned gate stack, the III-V substrate comprising source/drain regions adjacent to the sidewall spacers and field oxide regions formed adjacent to the source/drain regions; and growing metal contacts on the source/drain regions;

wherein growing metal contacts further comprises providing a carrier gas carrying a precursor in a reactor at a predetermined pressure while the III-V substrate has a predetermined temperature; and wherein the precursor comprises dimethyl-ethyl amine alane (DMEAA) and the predetermined temperature is between 150 Centigrade (C) and 360 C.

* * * * *